United States Patent
Higashi

(10) Patent No.: US 10,957,619 B2
(45) Date of Patent: Mar. 23, 2021

(54) SEMICONDUCTOR APPARATUS

(71) Applicant: FUJI ELECTRIC CO., LTD., Kanagawa (JP)

(72) Inventor: Nobuhiro Higashi, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 210 days.

(21) Appl. No.: 16/288,104

(22) Filed: Feb. 28, 2019

(65) Prior Publication Data

US 2019/0304867 A1 Oct. 3, 2019

(30) Foreign Application Priority Data

Apr. 2, 2018 (JP) ............................. JP2018-070720

(51) Int. Cl.
| | | |
|---|---|---|
| *H01L 23/367* | (2006.01) | |
| *H01L 23/049* | (2006.01) | |
| *H01L 23/34* | (2006.01) | |
| *H01L 35/20* | (2006.01) | |
| *H01L 35/32* | (2006.01) | |
| *H01L 23/495* | (2006.01) | |

(52) U.S. Cl.
CPC ........ *H01L 23/3675* (2013.01); *H01L 23/049* (2013.01); *H01L 23/34* (2013.01); *H01L 23/4952* (2013.01); *H01L 23/49513* (2013.01); *H01L 23/49537* (2013.01); *H01L 23/49562* (2013.01); *H01L 23/49568* (2013.01); *H01L 23/49575* (2013.01); *H01L 35/20* (2013.01); *H01L 35/32* (2013.01)

(58) Field of Classification Search
CPC ... H01L 23/049; H01L 23/34; H01L 23/3675; H01L 23/49513; H01L 23/4952; H01L 23/49537; H01L 23/49562; H01L 23/49568; H01L 23/49575; H01L 35/20; H01L 35/32

See application file for complete search history.

(56) References Cited

U.S. PATENT DOCUMENTS

| | | | |
|---|---|---|---|
| 2009/0046405 A1 | 2/2009 | Ichikawa | |
| 2014/0197514 A1 | 7/2014 | Mizuno | |
| 2015/0249083 A1 | 9/2015 | Okawara | |
| 2016/0293497 A1* | 10/2016 | Eckert | ..................... H01L 22/12 |

FOREIGN PATENT DOCUMENTS

| | | |
|---|---|---|
| JP | H0714948 A | 1/1995 |
| JP | 2006114575 A | 4/2006 |
| JP | 2006237331 A | 9/2006 |

(Continued)

*Primary Examiner* — Marvin Payen

(57) ABSTRACT

A semiconductor apparatus is provided, including: a housing; a heat-dissipation substrate; a first semiconductor chip provided on the heat-dissipation substrate; a temperature detecting unit provided on the housing; a first thermoelectric member electrically connecting the first semiconductor chip and the temperature detecting unit; and a second thermoelectric member electrically connecting the first semiconductor chip and the temperature detecting unit, the second thermoelectric member being made of a different material than the first thermoelectric member. The thermal conductivity of the heat-dissipation substrate is higher than the thermal conductivity of the housing.

16 Claims, 12 Drawing Sheets

(56) References Cited

FOREIGN PATENT DOCUMENTS

| | | |
|---|---|---|
| JP | 2009043780 A | 2/2009 |
| JP | 2009268336 A | 11/2009 |
| JP | 2009293986 A | 12/2009 |
| JP | 2015032689 A | 2/2015 |
| JP | 2015165541 A | 9/2015 |
| JP | 2016012647 A | 1/2016 |
| JP | 2016219772 A | 12/2016 |
| WO | 2013035173 A1 | 3/2013 |

* cited by examiner

A-A' CROSS SECTION

SEMICONDUCTOR APPARATUS

The contents of the following Japanese patent application(s) are incorporated herein by reference:
NO. 2018-070720 filed in JP on Apr. 2, 2018.

BACKGROUND

1. Technical Field

The present invention relates to a semiconductor apparatus.

2. Related Art

Conventionally, semiconductor apparatuses that detect the temperature of a semiconductor chip by using a temperature detecting diode have been known (see Patent Document 1, for example).

Patent Document 1: Japanese Patent Application Publication No. 2006-237331

With the conventional semiconductor apparatuses, the voltage induced as a function of temperature is small, and a large error may occur when it is amplified.

SUMMARY

To solve the foregoing issues, a semiconductor apparatus may be provided, including: a housing; a heat-dissipation substrate; a first semiconductor chip provided on the heat-dissipation substrate; a temperature detecting unit provided on the housing; a first thermoelectric member electrically connecting the first semiconductor chip and the temperature detecting unit; and a second thermoelectric member electrically connecting the first semiconductor chip and the temperature detecting unit, the second thermoelectric member being made of a different material than the first thermoelectric member. A thermal conductivity of the heat-dissipation substrate may be higher than a thermal conductivity of the housing.

The first semiconductor chip may include a first electrically-conductive pad to which the first thermoelectric member and the second thermoelectric member are connected.

The temperature detecting unit may include a temperature detecting element, and detect a temperature of the first semiconductor chip based on a temperature difference between a temperature of the temperature detecting unit and the temperature of the first semiconductor chip.

The temperature detecting unit may include a second electrically-conductive pad connected to the first thermoelectric member and the second thermoelectric member.

A material having a lower thermal conductivity than the heat-dissipation substrate may be provided between the first semiconductor chip and the temperature detecting unit.

The housing has an upper surface in a different plane than an upper surface of the heat-dissipation substrate.

The semiconductor apparatus may include: a first lead frame provided between the first semiconductor chip and the heat-dissipation substrate; and a second lead frame provided between the temperature detecting unit and the housing. A material having a lower thermal conductivity than the heat-dissipation substrate may be provided between the first lead frame and the second lead frame.

The first thermoelectric member may contain at least one of copper and a nickel-chromium alloy.

The second thermoelectric member may contain at least one of a copper-nickel alloy and a nickel alloy.

The first semiconductor chip may include a diode section and a transistor section. The first electrically-conductive pad may be provided in the diode section.

The transistor section may include an emitter electrode. The first electrically-conductive pad and the emitter electrode may be formed of a same material.

The first semiconductor chip may include an emitter electrode provided across the diode section and the transistor section. The first electrically-conductive pad may be provided above the emitter electrode in the diode section.

The semiconductor apparatus may further include a second semiconductor chip including a diode section. The first semiconductor chip may include a transistor section. The first electrically-conductive pad may be provided in the transistor section.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1A:
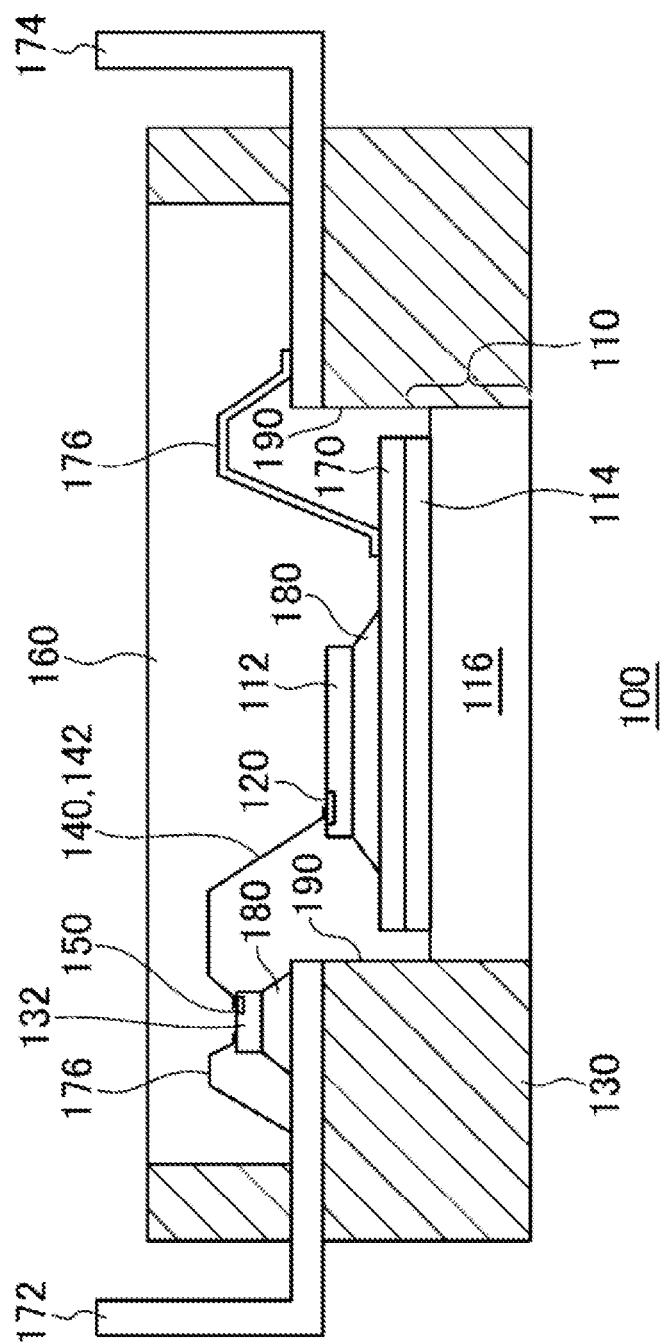
FIG. 1A shows a cross-sectional view of an example of a semiconductor apparatus 100.

FIG. 1A shows a cross-sectional view of an example of a semiconductor apparatus 100. The semiconductor apparatus 100 includes a heat-dissipation substrate 110, a semiconductor chip 112, a housing 130, a temperature detecting unit 132, a thermoelectric member 140, and a thermoelectric member 142.

The semiconductor chip 112 includes a semiconductor device such as an insulated gate bipolar transistor (IGBT).

The semiconductor chip 112 may include a vertical semiconductor device such as a transistor or a diode having electrodes on the respective, front and back surfaces. The semiconductor chip 112 may generate heat during switching operations. In an example, the temperature of the semiconductor chip 112 is measured by using a thermocouple. The semiconductor chip 112 may include an electrically-conductive pad 120 for connecting a thermocouple. The semiconductor chip 112 is an example of a first semiconductor chip.

The temperature detecting unit 132 detects the temperature of the semiconductor chip 112. The temperature detecting unit 132 in the present example detects the temperature difference, ΔTj, between the semiconductor chip 112 and the temperature detecting unit 132. Based on the temperature, Tj, of the temperature detecting unit 132 and the temperature difference ΔTj, the temperature detecting unit 132 detects the temperature, Tj+ΔTj, of the semiconductor chip 112. The temperature detecting unit 132 may include two electrically-conductive pads 150 for connecting the thermocouple. The temperature detecting unit 132 in the present example detects the temperature Tj by using a temperature detecting element such as a temperature detecting diode, and detects the temperature difference ΔTj by using the thermocouple. Using the thermocouple, the temperature detecting unit 132 does not need to include an amplification circuit for detecting the temperature difference ΔTj.

The thermoelectric member 140 and the thermoelectric member 142 serve as the thermocouple. The thermoelectric member 140 and the thermoelectric member 142 are made of materials different from each other. The thermoelectric member 140 and the thermoelectric member 142 electrically connect the semiconductor chip 112 and the temperature detecting unit 132. The thermoelectric member 140 and the thermoelectric member 142 are connected to the same electrically-conductive pads. For example, one end of the thermoelectric member 140 and one end of the thermoelectric member 142 are drawn from the electrically-conductive pad 120 of the semiconductor chip 112. The other end of the thermoelectric member 140 and the other end of the thermoelectric member 142 may are drawn from the two, respective electrically-conductive pads 150 of the temperature detecting unit 132.

Due to the Seebeck effect, a potential difference is generated between the thermoelectric member 140 and the thermoelectric member 142 as a function of the temperature difference ΔTj between the semiconductor chip 112 and the temperature detecting unit 132. Based on the potential difference between the thermoelectric member 140 and the thermoelectric member 142, the temperature detecting unit 132 can calculate the temperature difference ΔTj between the semiconductor chip 112 and the temperature detecting unit 132.

For example, the thermoelectric member 140 contains at least one of copper, a nickel-chromium alloy, and the like. The thermoelectric member 140 serves as the positive leg of the thermocouple. The thermoelectric member 142 may contain at least one of a copper-nickel alloy and a nickel alloy. The thermoelectric member 142 serves as the negative leg of the thermocouple.

The housing 130 houses the semiconductor chip 112 and the temperature detecting unit 132. The housing 130 is made of an insulative material. The housing 130 may be made of a material such as a resin having a low thermally-conductive property and a high thermally-resistant property. For example, the housing 130 is of polyphenylene sulfide (PPS). The temperature detecting unit 132 is provided on the housing 130.

The heat-dissipation substrate 110 is provided inside inner walls 190 of the housing 130. The heat-dissipation substrate 110 includes an insulating layer 114 and a base plate 116. The semiconductor chip 112 is provided on the heat-dissipation substrate 110. The heat-dissipation substrate 110 is formed of a material having a thermal conductivity higher than the thermal conductivity of the housing 130. This allows the heat-dissipation substrate 110 to dissipate the heat generated in the semiconductor chip 112 out of the semiconductor apparatus 100.

The base plate 116 has a thermally-conductive property and a heat-dissipation property. In an example, the base plate 116 contains aluminum, a copper alloy, and the like. The lower surface of the base plate 116 is exposed on the lower surface of the semiconductor apparatus 100, and is further connected to a heat-dissipation member such as a heatsink. The heatsink connected to the base plate 116 dissipates out the heat conducted from the semiconductor chip 112.

The insulating layer 114 is provided on one surface of the base plate 116. The insulating layer 114 contains a material having a thermal conductivity higher than the thermal conductivity of the housing 130. As an example, the insulating layer 114 contains an organic insulating material containing a thermally-conductive filler and a ceramic material such as aluminum nitride or aluminum oxide. The insulating layer 114 in the present example is provided between the base plate 116 and the semiconductor chip 112.

A lead frame 170 is provided between the heat-dissipation substrate 110 and the semiconductor chip 112. The semiconductor chip 112 is connected to the lead frame 170 with an adhesive member 180. The lead frame 170 is connected to the lead frame 174 by an electrically-conductive wire 176.

The lead frame 172 and the lead frame 174 are electrically connected to components external to the semiconductor apparatus 100. The lead frame 172 is provided between the housing 130 and the temperature detecting unit 132. The temperature detecting unit 132 is connected to the lead frame 172 with an adhesive member 180. The lead frame 172 is connected to the temperature detecting unit 132 by an electrically-conductive wire 176, and outputs signals from the temperature detecting unit 132 to external components.

In an example, the lead frame 170 may be made of a material having a higher thermal conductivity than the lead frame 172. This allows the lead frame 170 to easily conduct the heat of the semiconductor chip 112 to the heat-dissipation substrate 110. On the other hand, the lead frame 172 is less likely to conduct the heat of the housing 130 to the temperature detecting unit 132, so that the change in temperature of the temperature detecting unit 132 can be reduced.

An encapsulant 160 covers and surrounds the semiconductor chip 112 and the temperature detecting unit 132. The encapsulant 160 contains an insulative material such as resin. In an example, the encapsulant 160 contains a material having a lower thermal conductivity than the heat-dissipation substrate 110. This allows the heat generated in the semiconductor chip 112 to be preferentially dissipated to the heat-dissipation substrate 110.

The adhesive member 180 may be an electrically-conductive adhesive member such as solder. The adhesive member 180 preferably contains a material having a high thermal conductivity.

The housing 130 in the present example is formed of a material having a lower thermal conductivity than the heat-dissipation substrate 110. This allows the heat generated in the semiconductor chip 112 to be easily dissipated to the heat-dissipation substrate 110 in a preferential manner. This makes the heat generated in the semiconductor chip 112 less likely to be conducted toward the temperature detecting unit 132.

The space between the semiconductor chip 112 and the temperature detecting unit 132 is sealed with a material such as the encapsulant 160, having a low thermal conductivity. Thus, the temperature detecting unit 132 is less susceptible to the heat generation of the semiconductor chip 112. The encapsulant 160 in the present example is also provided between the lead frame 170 and the lead frame 172. This can reduce thermal conduction to the temperature detecting unit 132 through these lead frames.

The semiconductor chip 112 has an upper surface in a different plane than the upper surface of the temperature detecting unit 132. Compared with the case that the upper surfaces of the semiconductor chip 112 and the temperature detecting unit 132 are in the same plane, the distance between the semiconductor chip 112 and the temperature detecting unit 132 can easily be increased. Thus, the heat generation of the semiconductor chip 112 is less likely to affect the temperature detecting unit 132.

The semiconductor apparatus 100 in the present example includes the thermoelectric member 140 and the thermoelectric member 142 serving as a thermocouple, and therefore a large electromotive force can be generated without amplifying the the electromotive force causing change in temperature of the semiconductor chip 112. Thus, the semiconductor apparatus 100 can measure the change in temperature of the semiconductor chip 112 accurately, and therefore can issue an alert for overheat protection at a more accurate timing at a temperature near the overheat limit. This can extend the operable range to a value near the overheat limit of the semiconductor chip 112.

Figure 1B:
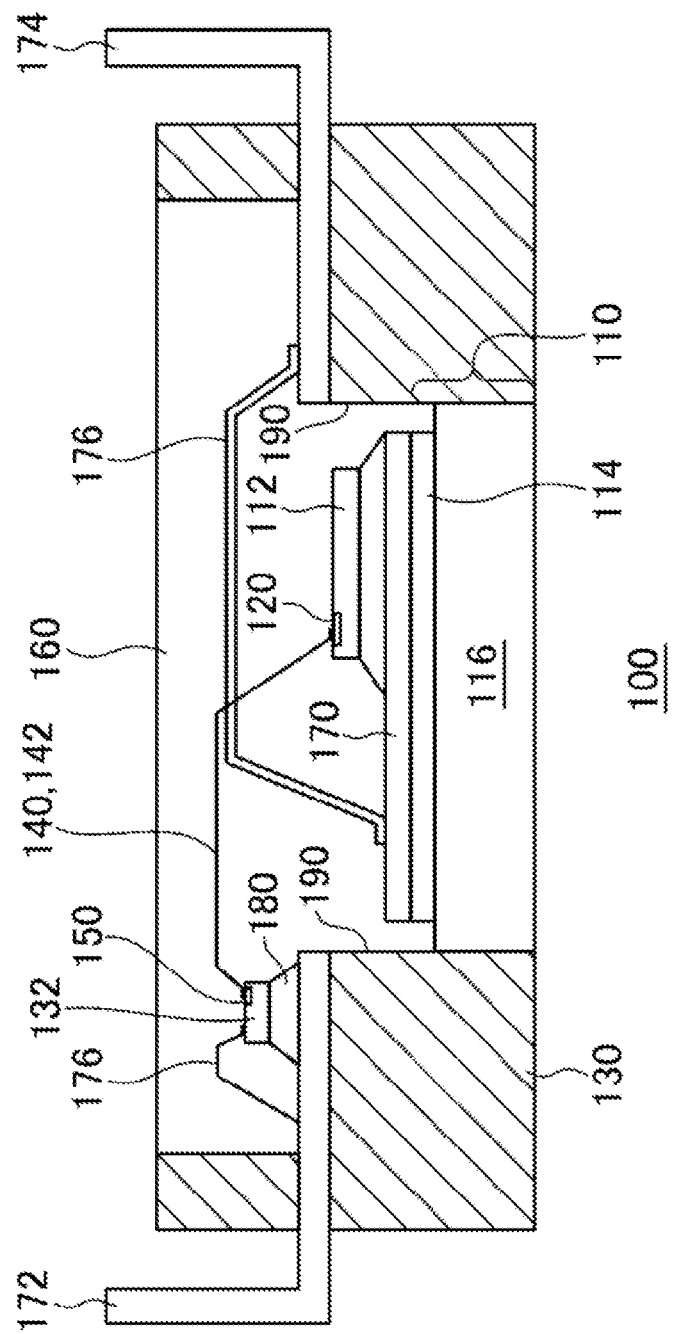
FIG. 1B shows a cross-sectional view of another example of the semiconductor apparatus 100, different than FIG. 1A.

FIG. 1B shows a cross-sectional view of another example of the semiconductor apparatus 100, different than FIG. 1A. FIG. 1B shows an embodiment preferable for increasing the distance between the semiconductor chip 112 and the temperature detecting unit 132.

Compared with the case of FIG. 1A, the semiconductor chip 112 in the present example is arranged at a position shifted in the direction opposite to the side on which the temperature detecting unit 132 is provided. That is, the semiconductor chip 112 in the present example is arranged at a position closer to the inner wall 190 opposite to the temperature detecting unit 132. This makes the temperature detecting unit 132 less susceptible to the heat generation of the semiconductor chip 112.

The electrically-conductive wire 176 in the present example is connected to the lead frame 174, extending above and across the semiconductor chip 112. That is, the connection point of the electrically-conductive wire 176 and the lead frame 170 is located between the semiconductor chip 112 and the temperature detecting unit 132. As the semiconductor chip 112 is arranged adjacent to the inner wall 190 opposite to the side on which the temperature detecting unit 132 is provided, and the upper surface of the semiconductor chip 112 is arranged in a different plane than the upper surface of the temperature detecting unit 132, the distance between the semiconductor chip 112 and the temperature detecting unit 132 is increased. Thus, thermal conduction from the semiconductor chip 112 to the temperature detecting unit 132 is reduced, and the change in temperature of the temperature detecting unit 132 is reduced.

Figure 2:
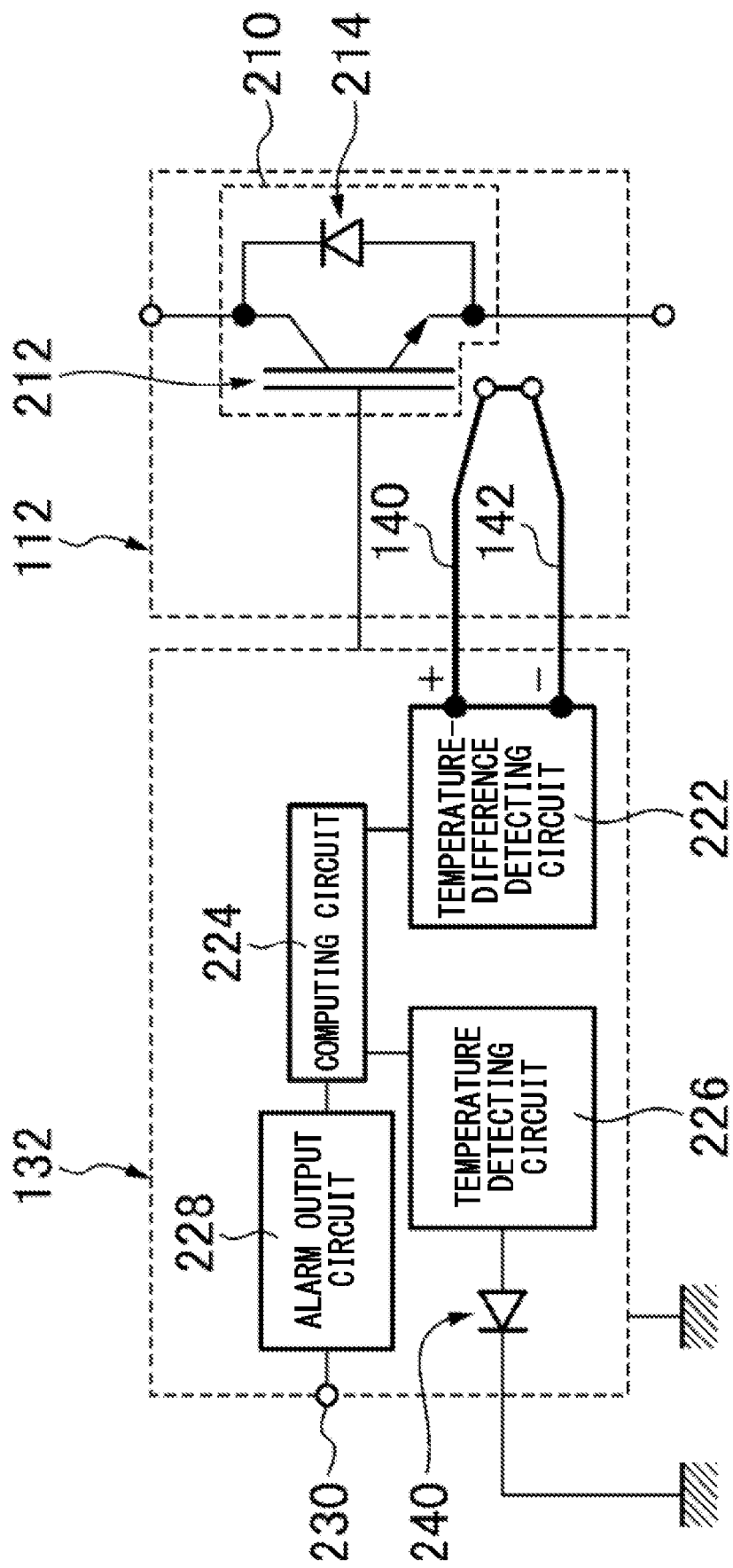
FIG. 2 is a block diagram showing an example of circuits of the semiconductor apparatus 100.

FIG. 2 is a block diagram showing an example of circuits of the semiconductor apparatus 100. This figure shows the circuits included in the semiconductor chip 112 and the temperature detecting unit 132 in a block diagram. The semiconductor chip 112 in the present example includes, but not limited to, an RC-IGBT 210.

The RC-IGBT 210 includes a transistor section 212 and a diode section 214 on the same chip. The transistor section 212 may include an IGBT. The diode section 214 may include a free wheeling diode (FWD).

The temperature detecting unit 132 includes a temperature-difference detecting circuit 222, a computing circuit 224, a temperature detecting circuit 226, an alarm output circuit 228, and a temperature-warning output terminal 230. The temperature-difference detecting circuit 222 is connected to the semiconductor chip 112 by the thermoelectric member 140 and the thermoelectric member 142. The temperature-difference detecting circuit 222 detects the temperature difference $\Delta Tj$ by means of computations based on the potential difference between the thermoelectric member 140 and the thermoelectric member 142.

The temperature rise $\Delta Tj$ during operation of the semiconductor chip 112 may be 125 degrees or less, may be 150 degrees or less, or may be 200 degrees or less. For example, the potential difference between the thermoelectric member 140 and the thermoelectric member 142 during operation of the semiconductor chip 112 is 1 V or more and 10 V or less.

The temperature detecting circuit 226 detects the temperature Tj of the temperature detecting unit 132. The temperature detecting unit 132 is likely to generate less heat than the semiconductor chip 112. The temperature detecting unit 132 is preferably less susceptible to the heat generation of the semiconductor chip 112. This makes the change in temperature of the temperature detecting unit 132 less than the change in temperature of the semiconductor chip 112 even during operation of the semiconductor apparatus 100. The change in temperature of the temperature detecting unit 132 may be 1 degree or less, or may be 5 degrees or less.

For example, the temperature detecting circuit 226 amplifies the voltage detected by the temperature detecting element 240, and detects the temperature Tj of the temperature detecting unit 132 based on the amplified voltage. Since the change in temperature of the temperature detecting unit 132 is small, the measurement error is small even though the voltage of the temperature detecting element 240 is amplified. The temperature detecting element 240 is a diode for temperature detection, as an example.

The computing circuit 224 is connected to the temperature-difference detecting circuit 222 and the temperature detecting circuit 226. The computing circuit 224 calculates the temperature $Tj+\Delta Tj$ of the semiconductor chip 112 by adding the temperature difference $\Delta Tj$ to the temperature Tj.

The alarm output circuit 228 outputs warning signals. The alarm output circuit 228 is connected to the temperature-warning output terminal 230. For example, when the temperature $Tj+\Delta Tj$ exceeds a predetermined threshold, the alarm output circuit 228 outputs a warning signal indicating an abnormal value from the temperature-warning output terminal 230. The temperature-warning output terminal 230 may be connected to an external circuit for driving the semiconductor chip 112. The external circuit stops the operation of the semiconductor chip 112 when receiving an warning signal indicating that $Tj+\Delta Tj$ exceeds an overheat-protection temperature TjOH from the temperature-warning output terminal 230.

The temperature detecting unit 132 in the present example detects the temperature Tj by using the temperature detecting element 240, and detects the temperature difference $\Delta Tj$ by using the thermocouple. Here, since the temperature Tj is not susceptible to the heat generation of the semiconductor chip 112, it is not likely to vary. On the other hand, the temperature difference ΔTj easily varies due to the heat generation of the semiconductor chip 112. The temperature detecting unit 132 uses the thermocouple to detect the temperature difference ΔTj, which varies relatively largely, and thus the effect of the heat generation of the semiconductor chip 112 can be reduced. Due to the reduced effect of the heat generation of the semiconductor chip 112, although the temperature detecting unit 132 uses the temperature detecting element 240 to detect the temperature of the temperature detecting unit 132, an error in temperature detection is less likely to occur. In the temperature detecting unit 132, the region in which the temperature-difference detecting circuit 222 is provided may be arranged between the semiconductor chip 112 and the region in which the temperature detecting circuit 226 and the temperature detecting element 240 are provided.

Figure 3:
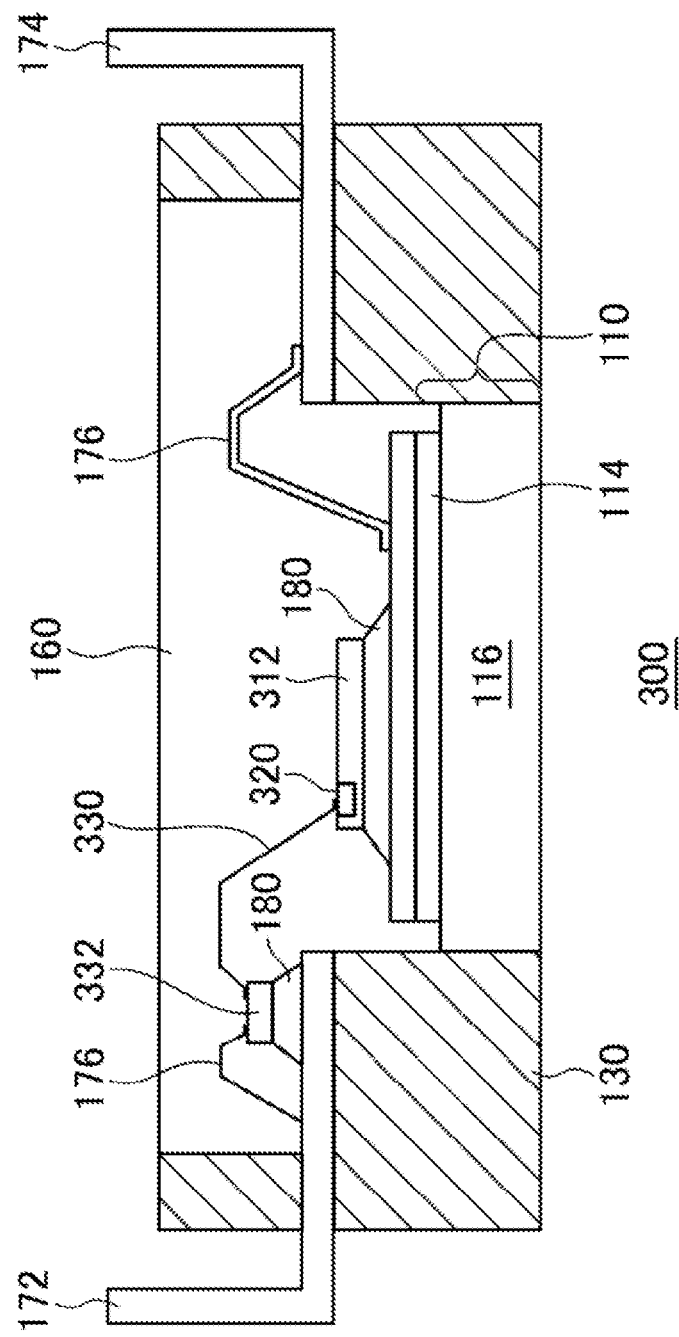
FIG. 3 is a cross-sectional view of a semiconductor apparatus 300 according to a comparative example.

FIG. 3 is a cross-sectional view of a semiconductor apparatus 300 according to a comparative example. The semiconductor apparatus 300 includes a heat-dissipation substrate 110, and a semiconductor chip 312 and a temperature detecting unit 332 provided above the heat-dissipation substrate 110.

The semiconductor chip 312 includes an electrically-conductive pad 320. A connecting wire 330 is connected between the electrically-conductive pad 320 and the temperature detecting unit 332. The connecting wire 330 is drawn from the positive side of a temperature detecting diode 410.

On the other hand, in the semiconductor apparatus 100, two wires of the thermoelectric member 140 and the thermoelectric member 142 are drawn from the electrically-conductive pad 120. In order that the thermoelectric member 140 and the thermoelectric member 142 operate as a thermocouple, the semiconductor chip 112 and the temperature detecting unit 132 are connected by different thermoelectric members.

Figure 4:
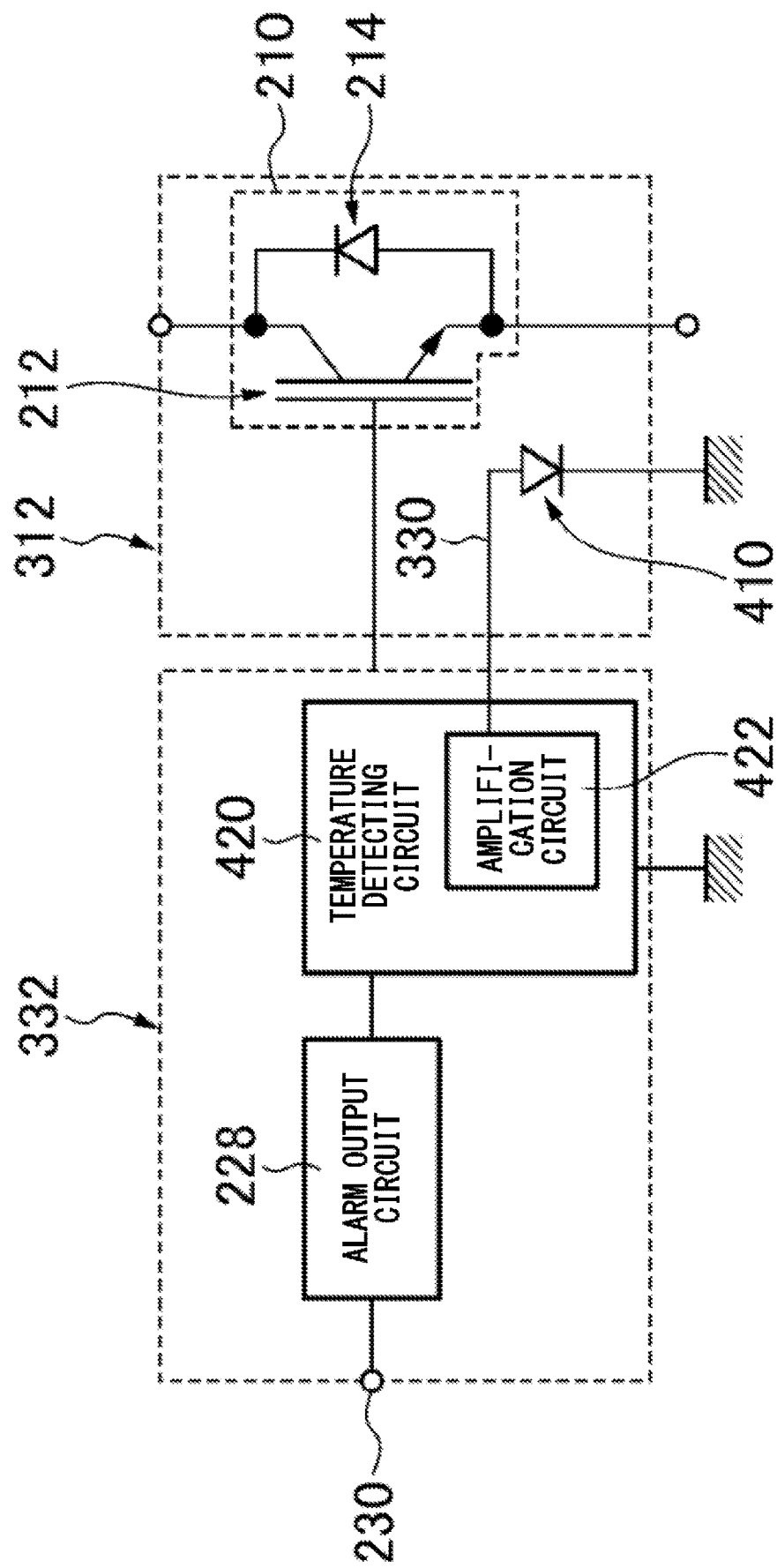
FIG. 4 is a block diagram showing an example of circuits of the semiconductor apparatus 300.

FIG. 4 is a block diagram showing an example of circuits of the semiconductor apparatus 300 according to the comparative example. This figure shows circuits including the semiconductor chip 312 and the temperature detecting unit 332 in a block diagram.

The semiconductor chip 312 includes an RC-IGBT 210. However, the circuit included in the semiconductor chip 312 may be a different circuit.

The temperature detecting unit 332 includes a temperature detecting circuit 420 and an alarm output circuit 228. The alarm output circuit 228 includes an amplification circuit 422 including an OP amplifier or the like.

In the case that the semiconductor chip 312 includes the RC-IGBT 210, the semiconductor chip 312 includes a transistor section 212 and a diode section 214 in circuits on the same chip.

Instead of the thermoelectric member 140 and the thermoelectric member 142 according to the embodiment of FIG. 2, the semiconductor chip 312 includes a temperature detecting diode 410. The positive side of the temperature detecting diode 410 is connected to the temperature detecting unit 332 by using a connecting wire 330.

The connecting wire 330 is connected to the amplification circuit 422 of the temperature detecting unit 332. The negative side of the temperature detecting diode 410 may be connected to an external component, or may also be grounded.

Due to the temperature characteristics of the temperature detecting diode 410, an electromotive force is generated between the positive and negative electrodes of the temperature detecting diode 410 as a function of the temperature Tj+ΔTj of the semiconductor chip 112, to which the temperature detecting diode 410 is connected. The voltage generated by the electromotive force has a magnitude of about 0.7 V to 1.0 V, for example, and is amplified by the amplification circuit 422.

The temperature detecting circuit 420 can read the absolute value of a temperature equivalent to Tj+ΔTj of the semiconductor chip 312 from the value of the voltage amplified by the amplification circuit 422. In this configuration, a voltage proportional to the temperature Tj+ΔTj of the semiconductor chip 312, rather than the temperature difference ΔTj between the semiconductor chip 312 and the temperature detecting unit 332, is amplified for reading.

In the embodiment of FIG. 4, to perform temperature detection, a voltage proportional to the temperature Tj+ΔTj is read by amplifying the voltage generated in the temperature detecting diode 410, having a lower electromotive force than the thermocouple. Thus, the error in measurement of the temperature detecting circuit 420 affected by both of the error due to the characteristics of the temperature detecting diode 410 and the error due to the characteristics of the amplification circuit 422, and becomes a large value.

On the other hand, the semiconductor apparatus 100 detects a voltage proportional to ΔTj by using the thermocouple. Since the electromotive force of the thermocouple is larger than the electromotive force of the temperature detecting diode 410, the amplification circuit is not required, so that the error due to the amplification by the amplification circuit does not occur. Thus, accurate measurement with a small measurement error can be performed.

Figure 5:
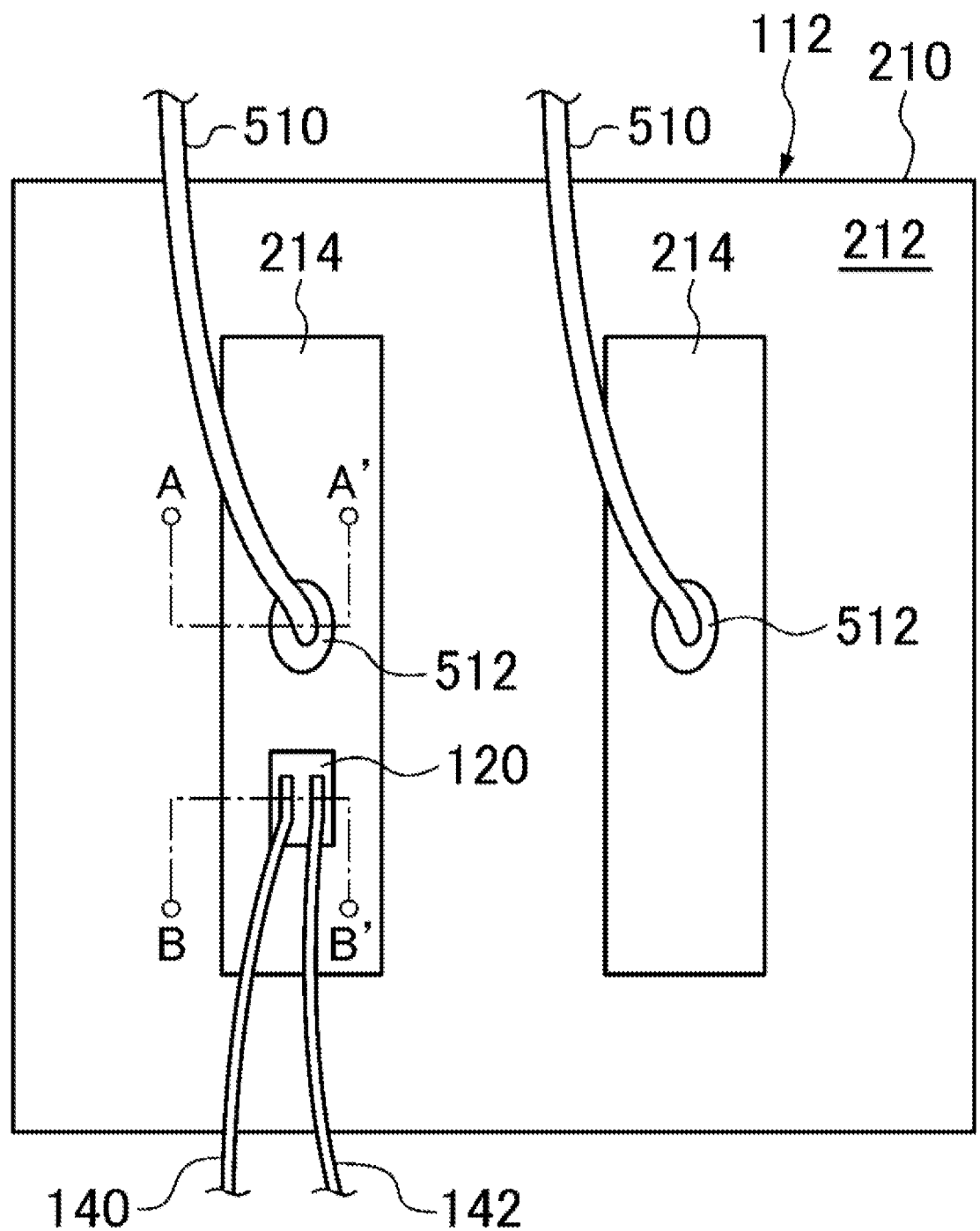
FIG. 5 is a top view of an example in which a semiconductor chip 112 includes a transistor section 212 and diode sections 214.

FIG. 5 is a top view of an example in which the semiconductor chip 112 includes a transistor section 212 and diode sections 214. In the case that the semiconductor chip 112 includes the RC-IGBT 210, the diode sections 214 including FWDs occupying rectangular regions are arranged side by side on the upper surface of the semiconductor chip 112, and the transistor section 212 including IGBTs is arranged in the other portion.

Diode-section wires 510 extending to the outside of the RC-IGBT 210 may be connected to the top of the diode sections 214 with solder balls 512. The electrically-conductive pad 120 is arranged on the upper surface of a diode section 214. The thermoelectric member 140 and the thermoelectric member 142 are drawn from the electrically-conductive pad 120.

While FIG. 5 illustrates an example in which there are two diode sections 214, the number is not limited to two. The electrically-conductive pad 120, the thermoelectric member 140 and the thermoelectric member 142 may be provided to the diode section 214 at a position more likely to generate heat or a position more likely to accumulate heat. However, the position and number of the electrically-conductive pad 120, the thermoelectric member 140 and the thermoelectric member 142 provided are not limited.

Recently, there is a demand for reducing the entire size of the semiconductor chip 112 due to the demand for increasing the scale of integration of semiconductors. Comparing the transistor section 212 and the diode section 214, the size of the diode section 214 may be preferentially reduced for structural reasons.

For example, the reduced size of the diode section 214 lowers the heat capacity of the diode section 214. The transistor section 212 and the diode section 214 are both circuits that generate heat during operation. In the RC-IGBT, if the size of the diode section is reduced relative to the transistor section 212, the change in temperature of the diode section 214 becomes larger.

Thus, in the case that the semiconductor chip 112 includes the RC-IGBT 210, the electrically-conductive pad 120 may be provided in the diode section 214. In this manner, the change in temperature of the diode section 214, which may occur more easily than the change in temperature of the transistor section 212, can be measured, so that accurate overheat protection can be achieved.

Figure 6:
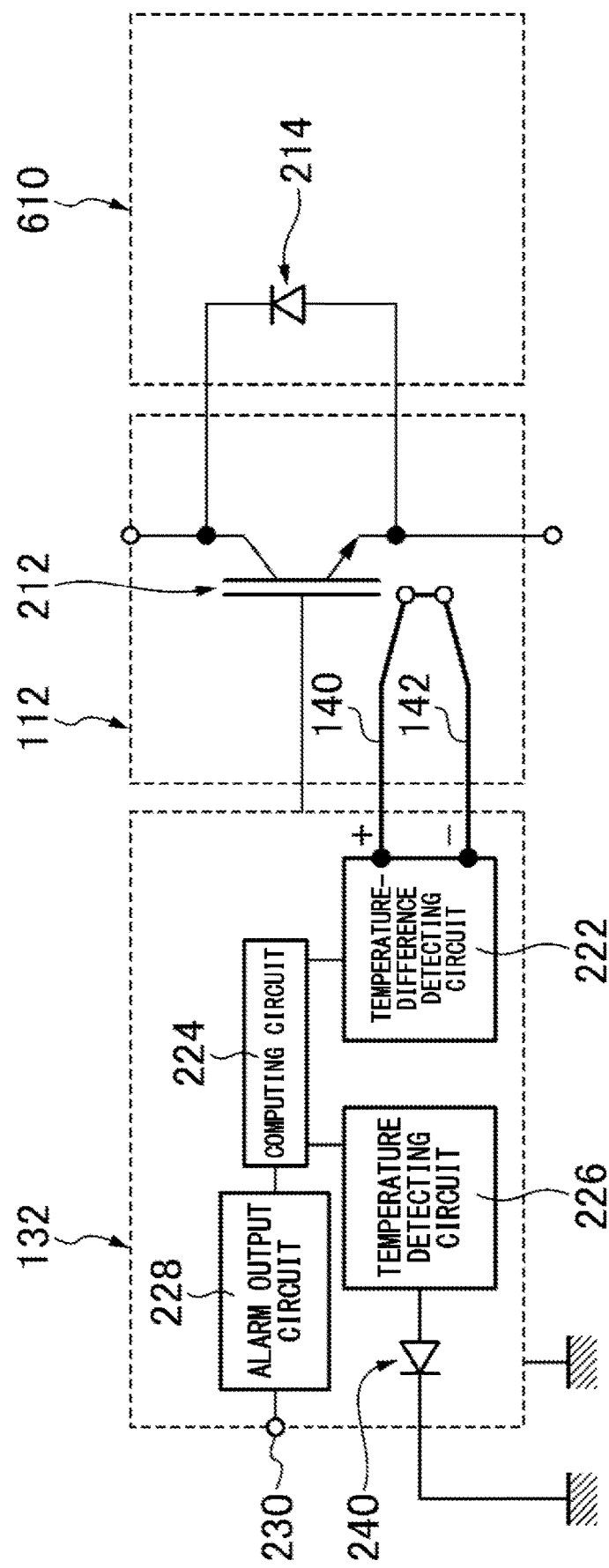
FIG. 6 shows an embodiment in which the semiconductor apparatus 100 includes a semiconductor chip 610 in addition to the semiconductor chip 112.

FIG. 6 shows an embodiment in which the semiconductor apparatus 100 includes a semiconductor chip 610 in addition to the semiconductor chip 112. The semiconductor apparatus 100 may include a semiconductor chip 610 in addition to the semiconductor chip 112.

As an example, the semiconductor chip 112 includes the transistor section 212, and the semiconductor chip 610 includes the diode section 214. In the case that the transistor section 212 and the diode section 214 are provided on different chips, reduction of the chip size and increase of the integration scale are attempted for each of the semiconductor chip 112 and the semiconductor chip 610.

If the transistor section 212 and the diode section 214 are provided on different chips, the electrically-conductive pad 120 may be provided in the transistor section 212. In terms of heat resistance, the transistor section 212 is usually a part that is more vulnerable to overheat than the diode section 214. Overheat-monitoring of the transistor section 212 can provide sufficient overheat protection by means of circuits.

Further to providing the electrically-conductive pad 120 in the transistor section 212, an electrically-conductive pad similar to the electrically-conductive pad 120 may be provided in the diode section 214. This can provide further overheat protection for the entire circuit. The number of electrically-conductive pads provided may be increased or decreased in consideration of manufacturing cost and spatial balance for circuit arrangement.

Figure 7:
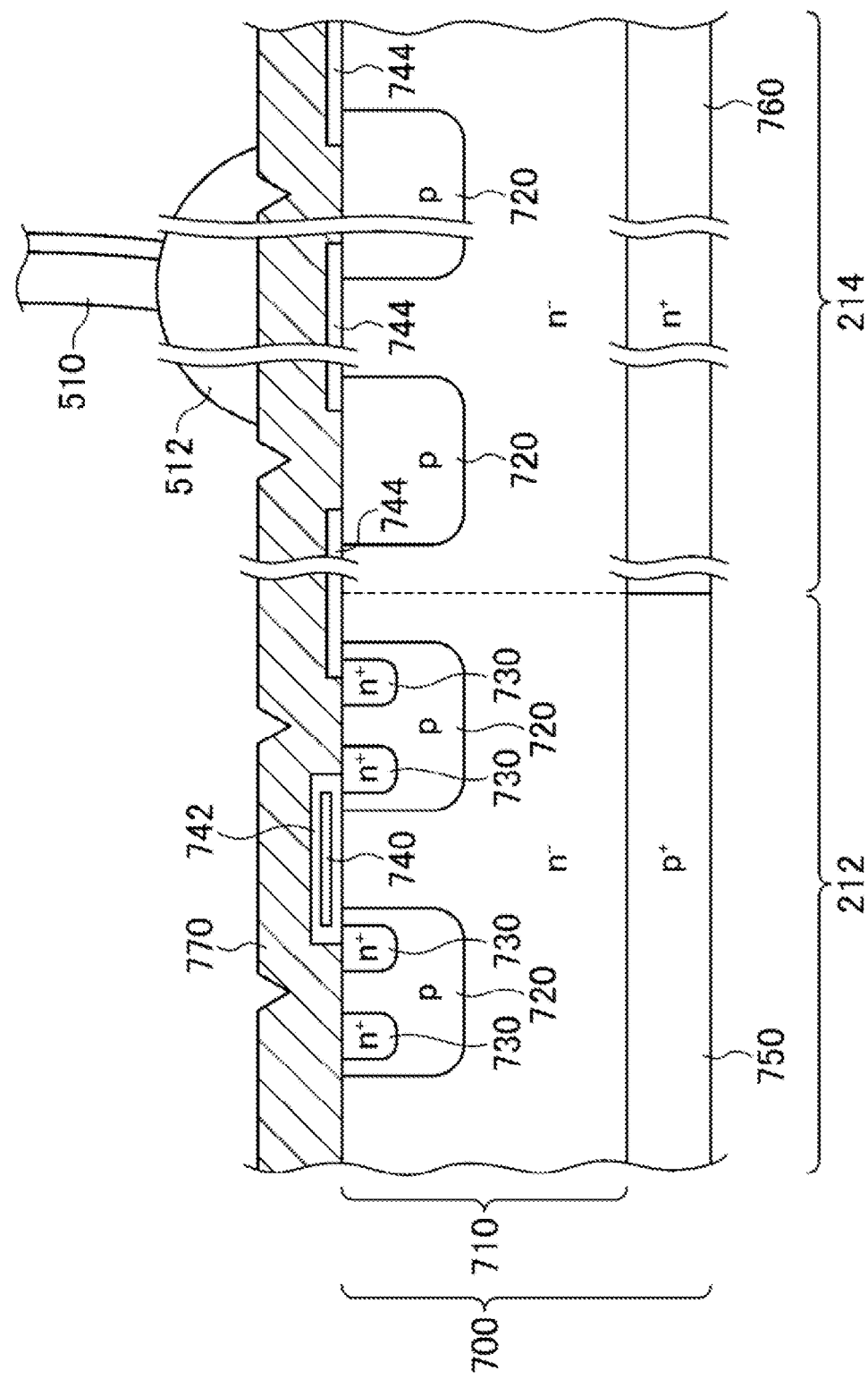
FIG. 7 is an A-A' cross-sectional view, taken along A-A' in FIG. 5.

FIG. 7 is an A-A' cross-sectional view, taken along A-A' in FIG. 5. The semiconductor chip 112 includes a semiconductor substrate 700.

The semiconductor substrate 700 includes an n⁻-type drift region 710 in the diode section 214. Each p-type body region 720 is provided in contact with the lower surface of a metal layer 770 in the drift region 710.

Further, in the transistor section 212, two n⁺-type emitter regions 730 are provided for each p-type body region 720 at portions contacting the upper surface of the semiconductor substrate 700. An interlayer dielectric film 742 covering a gate electrode 740 is provided across emitter regions 730 in different p-type body regions 720 and on the upper surfaces of the emitter regions 730.

In the diode section 214, diode-section insulating films 744 are each provided astride p-type body regions 720. The metal layer 770 is provided to cover the upper surface of the semiconductor substrate 700, the interlayer dielectric film 742, and the upper surfaces of the diode-section insulating films 744.

The metal layer 770 serves as an emitter electrode. A diode-section wire 510 is connected to the metal layer 770 with a solder ball 512.

In a region below the drift region and contacting the lower surface of the semiconductor substrate 700, the transistor section 212 includes a p⁺-type collector region 750, while the diode section 214 includes a n⁺-type cathode region 760.

Figure 8:
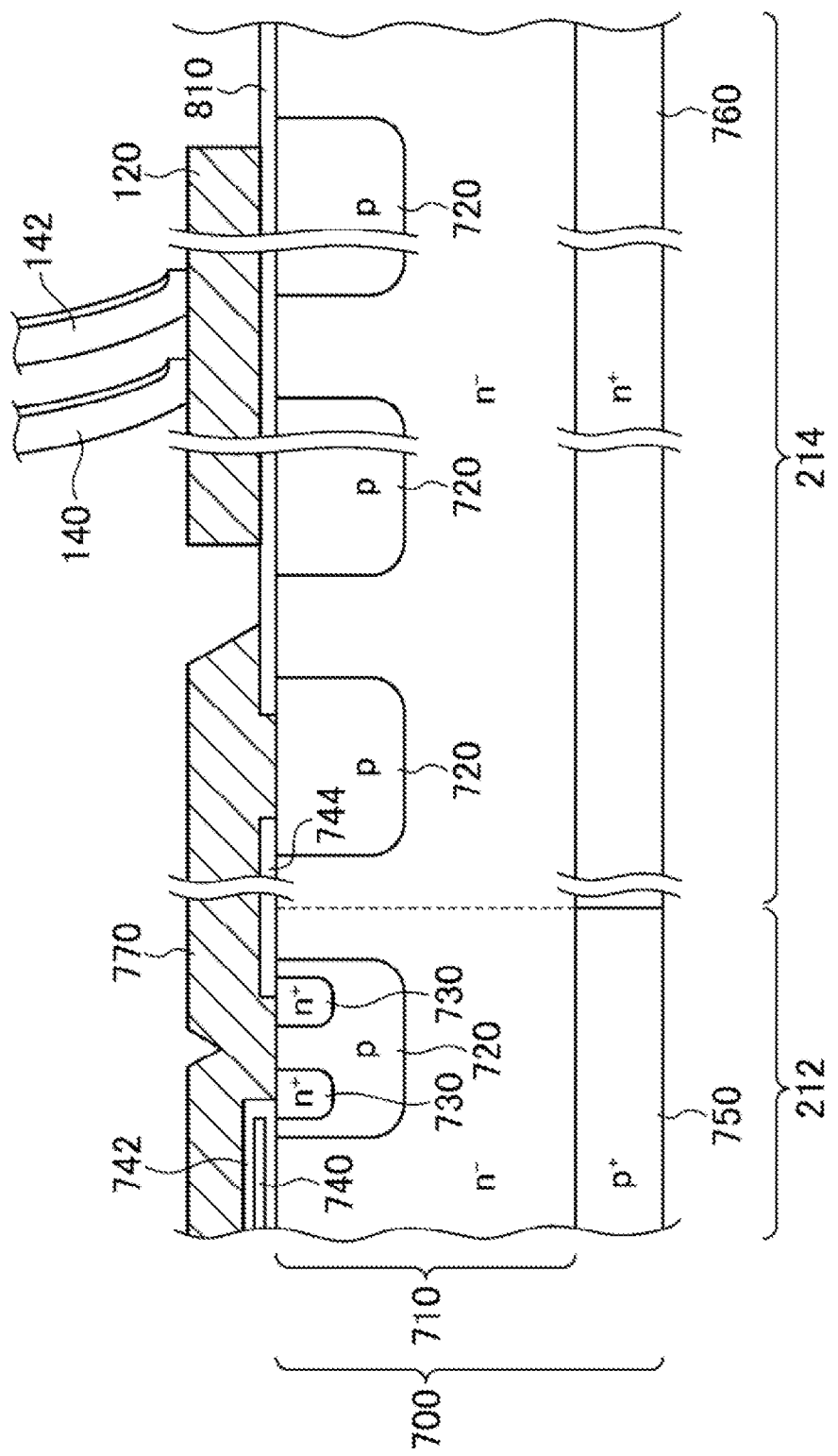
FIG. 8 shows one embodiment of a cross section along B-B' in FIG. 5.

FIG. 8 shows one embodiment of a cross section along B-B' in FIG. 5. In FIG. 8, an electrically-conductive pad 120 is formed on the upper surface of the diode section 214.

In the diode section 214, an insulating film 810 is provided on the upper surfaces of a plurality of p-type body regions 720. The electrically-conductive pad 120 is formed by separating a portion of the metal layer 770. That is, the step of providing the metal layer 770 on the upper surface of the semiconductor substrate 700 includes a step of providing the electrically-conductive pad 120 above the diode section 214.

A thermoelectric member 140 and a thermoelectric member 142 are connected to the top of the electrically-conductive pad 120. Since the electrically-conductive pad 120 in FIG. 8 is formed of the same material as the metal layer 770 and a separate process is not involved for forming the electrically-conductive pad 120, the entire process can be simplified and cost can be reduced.

In the embodiment according to FIG. 8, the transistor section 212 includes the metal layer 770 provided on the upper surface of the semiconductor substrate 700 in the transistor section 212. The metal layer 770 serves as the emitter electrode of the transistor section 212.

The diode section 214 includes the metal layer 770 on the upper surface of the semiconductor substrate 700. The metal layer 770 is provided in regions other than the region in which the insulating film 810 is provided on the upper surface of the semiconductor substrate 700. The transfer of carriers in the semiconductor substrate 700 also occurs below the insulating film 810 in a manner similar to other portions. Thus, the function of the diode section 214 is not affected by the provision of the insulating film 810.

Figure 9:
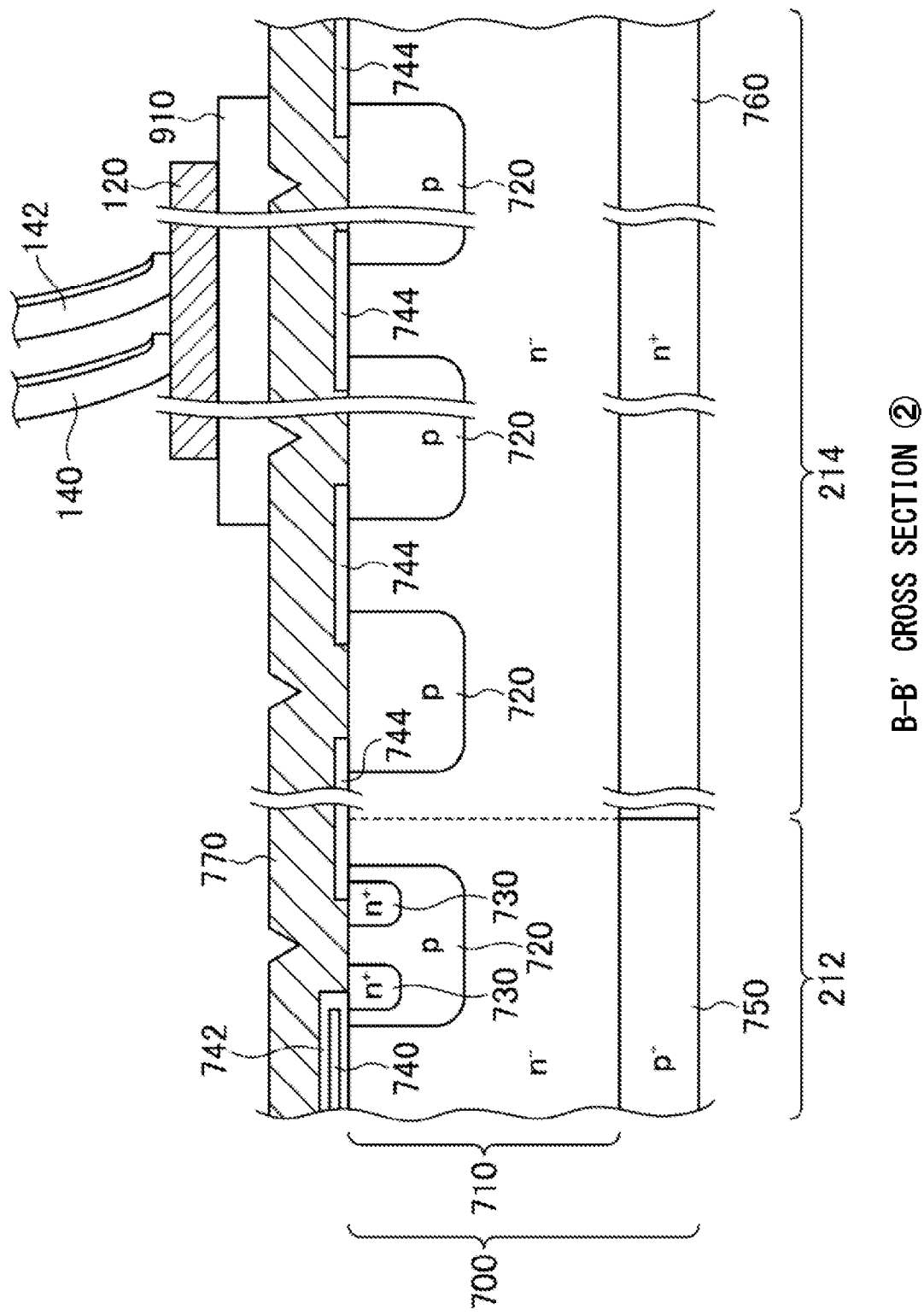
FIG. 9 shows a cross-sectional view along B-B' in FIG. 5 according to another embodiment, different than FIG. 8.

FIG. 9 shows a cross-sectional view taken along B-B' in FIG. 5 according to another embodiment, different than FIG. 8. In the embodiment of FIG. 9, in the B-B' cross section, the metal layer 770 extends across the transistor section 212 and the diode section 214. An insulating pad 910 is further provided on the upper surface of the metal layer 770 provided on the upper surface of the diode section 214. The electrically-conductive pad 120 is provided on the upper surface of the insulating pad 910.

Figure 10:
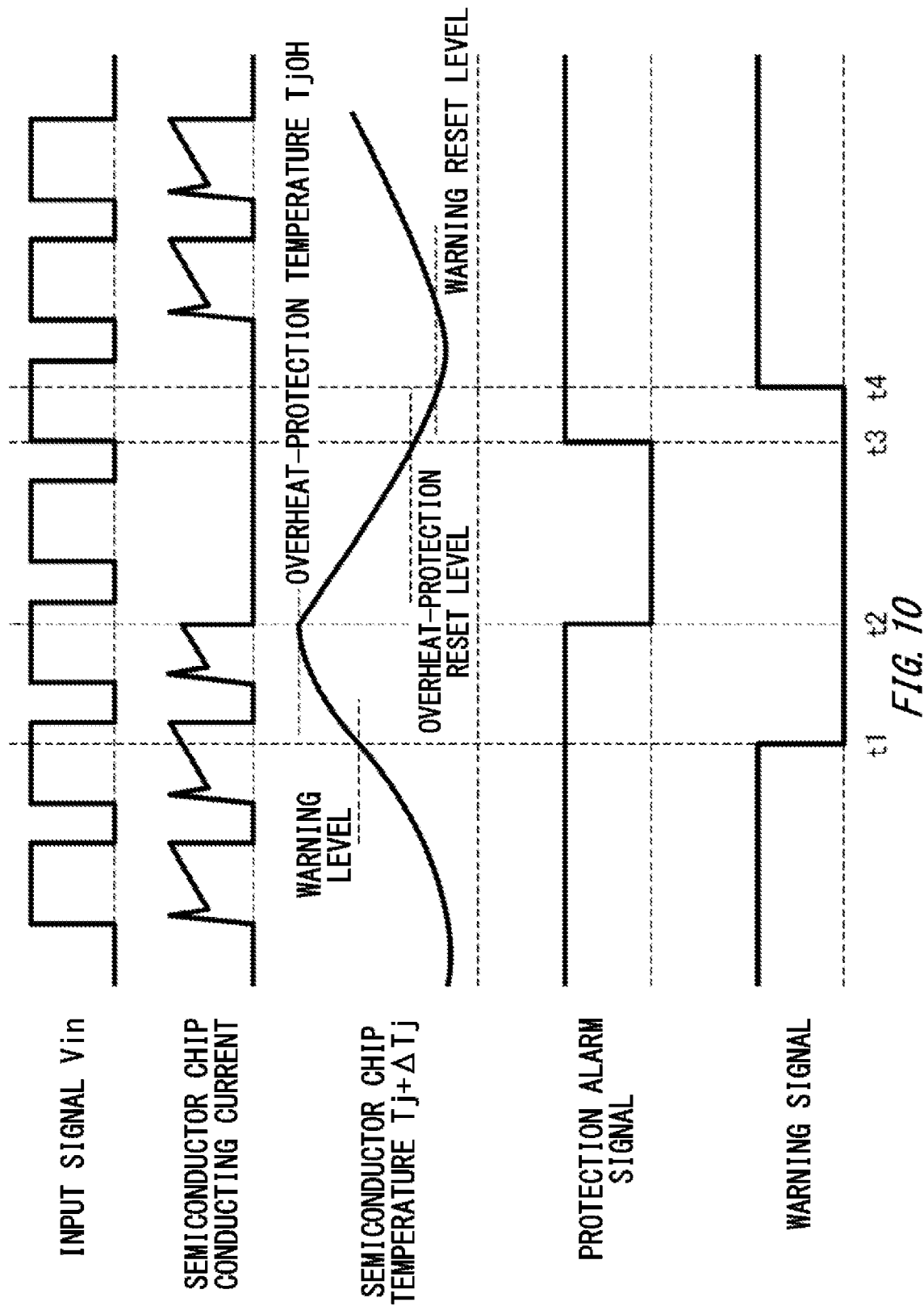
FIG. 10 shows an operation sequence of the overheat-protection function of the semiconductor chip 112.

FIG. 10 shows an operation sequence of the overheat-protection function of the semiconductor chip 112. An input signal Vin is input to the semiconductor chip 112, always at constant pulse intervals.

The semiconductor chip 112 includes heat-generating switching devices such as the transistor section 212 and the diode section 214. At time t1, when the chip temperature $Tj+\Delta Tj$ of the semiconductor chip 112 reaches an predetermined warning level, the alarm output circuit 228 changes the value of a warning signal, and an external circuit receives the signal and then issues a warning.

At time t2, when the chip temperature $Tj+\Delta Tj$ of the semiconductor chip 112 reaches a predetermined overheat-protection temperature TjOH, the value of a protection alarm signal sent by the alarm output circuit 228 is changed to a value indicating abnormality, and currents in the semiconductor chip 112 are shut off. When the currents in the semiconductor chip 112 are shut off, the semiconductor chip 112 stops generating heat, and the temperature $Tj+\Delta Tj$ of the semiconductor chip 112 begins to decrease.

At time t3, when the temperature $Tj+\Delta Tj$ of the semiconductor chip decreases to a predetermined overheat-protection reset level, the value of the protection alarm signal returns to a normal value. At time t3, no current is conducted in the semiconductor chip 112 for safety.

At time t4, when the temperature $Tj+\Delta Tj$ of the semiconductor chip decreases to a predetermined warning reset level, the value of the warning signal is changed and warning sending is stopped. After t4, the conducting current in the semiconductor chip 112 begins to flow in the switching device again. In the above manner, the semiconductor chip temperature Tj+ΔTj is prevented from turning into a overheat condition.

Figure 11:
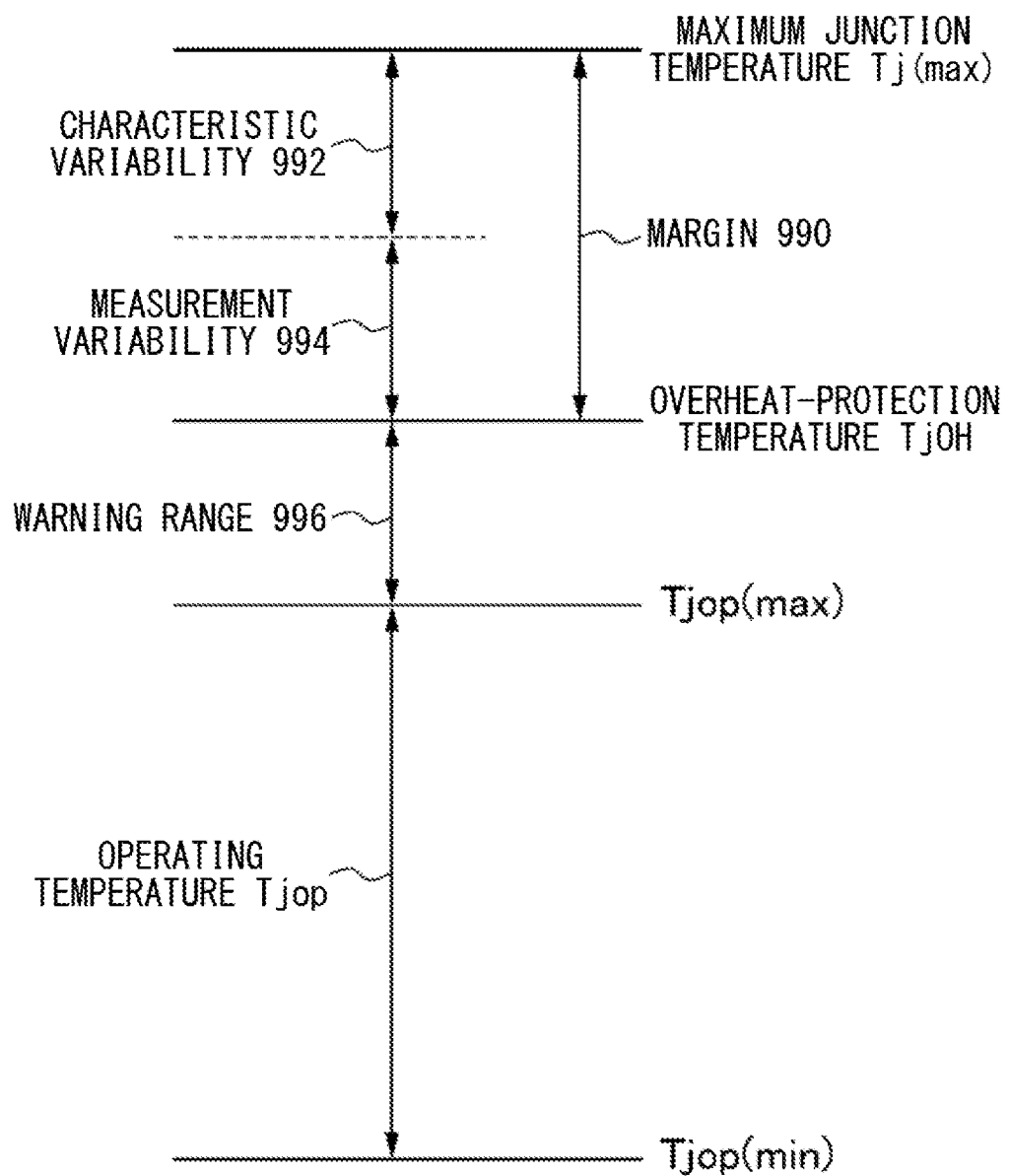
FIG. 11 is a conceptual view of overheat protection of the semiconductor apparatus 100 according to an example embodiment.

FIG. 11 is a conceptual view of overheat protection of the semiconductor chip 112. The semiconductor chip 112 can operate without the risk of overheat such that the temperature Tj+ΔTj is within the range of operating temperatures Tjop.

The lower limit of Tj op is the minimum operating junction temperature, Tjop(min), of the switching device included in the semiconductor chip 112. The upper limit of Tjop is an operating junction temperature Tjop(max) of the semiconductor chip 112.

Tjop(max) may be the same temperature as the warning level in FIG. 10. In this case, when the temperature of the semiconductor chip 112 rises to Tjop(max), the alarm output circuit 228 sends a warning signal.

The maximum junction temperature Tj(max) of the semiconductor chip 112 is the maximum temperature that is operable without damaging the circuits on the semiconductor chip 112. The temperature of the entire circuits is monitored such that the temperature does not rise to Tj(max).

When the temperature Tj+ΔTj of the semiconductor chip 112 reaches the overheat-protection temperature TjOH, currents in the semiconductor chip 112 are shut off. In this case, a warning range 996 is a temperature range from TjOp(max) to TjOH. TjOH is set to a value lower than Tj (max) by the amount of a margin 990 of the operable temperature region for temperature variability.

The margin 990 includes characteristic variability 992 of the thermoelectric member 140 and the thermoelectric member 142 and measurement variability 994 of the temperature detecting unit 132. The measurement variability 994 includes errors caused due to the characteristics of the amplification circuit 422.

The margin 990 has a width that is greater than or equal to the sum of the characteristic variability 992 and the measurement variability 994. This is because, if the margin 990 is set to less than the sum of the characteristic variability 992 and the measurement variability 994, the temperature of the semiconductor chip 112 may actually exceeds Tj(max) when the temperature detecting unit 132 determines that the semiconductor chip temperature Tj+ΔTj reaches TjOH.

In the embodiments using the thermoelectric member 140 and the thermoelectric member 142, the characteristic variability 992 and the measurement variability 994 can both be reduced compared with the comparative example using the temperature detecting diode 410. The thermocouple has more accurate temperature-response characteristics than the temperature detecting diode 410 in the comparative example, so that the characteristic variability 992 is reduced. While in the comparative example the measurement variability 994 is increased due to the presence of the amplification circuit 422 in the semiconductor apparatus 300, the use of the thermocouple eliminates the need for the amplification circuit 422, so that the measurement variability 994 can also be reduced.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor apparatus comprising:
    a housing;
    a heat-dissipation substrate;
    a first semiconductor chip provided on the heat-dissipation substrate;
    a temperature detecting unit provided on the housing;
    a first thermoelectric member electrically connecting the first semiconductor chip and the temperature detecting unit; and
    a second thermoelectric member electrically connecting the first semiconductor chip and the temperature detecting unit, the second thermoelectric member being made of a different material than the first thermoelectric member,
    wherein a thermal conductivity of the heat-dissipation substrate is higher than a thermal conductivity of the housing.

2. The semiconductor apparatus according to claim 1, wherein the first semiconductor chip comprises a first electrically-conductive pad to which the first thermoelectric member and the second thermoelectric member are connected.

3. The semiconductor apparatus according to claim 1, wherein the temperature detecting unit comprises a temperature detecting element, and detects a temperature of the first semiconductor chip based on a temperature difference between a temperature of the temperature detecting unit and the temperature of the first semiconductor chip.

4. The semiconductor apparatus according to claim 1, wherein the temperature detecting unit comprises a second electrically-conductive pad connected to the first thermoelectric member and the second thermoelectric member.

5. The semiconductor apparatus according to claim 1, wherein a material having a lower thermal conductivity than the heat-dissipation substrate is provided between the first semiconductor chip and the temperature detecting unit.

6. The semiconductor apparatus according to claim 1, wherein the housing has an upper surface in a different plane than an upper surface of the heat-dissipation substrate.

7. The semiconductor apparatus according to claim 1, further comprising:
    a first lead frame provided between the first semiconductor chip and the heat- dissipation substrate; and
    a second lead frame provided between the temperature detecting unit and the housing,
    wherein a material having a lower thermal conductivity than the heat-dissipation substrate is provided between the first lead frame and the second lead frame.

8. The semiconductor apparatus according to claim 1, wherein the first thermoelectric member contains at least one of copper and a nickel-chromium alloy.

9. The semiconductor apparatus according to claim 1, wherein the second thermoelectric member contains at least one of a copper-nickel alloy and a nickel alloy.

10. The semiconductor apparatus according to claim 2, wherein:
the first semiconductor chip comprises a diode section and a transistor section; and
the first electrically-conductive pad is provided in the diode section.

11. The semiconductor apparatus according to claim 10, wherein:
the transistor section comprises an emitter electrode; and
the first electrically-conductive pad and the emitter electrode are formed of a same material.

12. The semiconductor apparatus according to claim 10, wherein:
the first semiconductor chip comprises an emitter electrode provided across the diode section and the transistor section; and
the first electrically-conductive pad is provided above the emitter electrode in the diode section.

13. The semiconductor apparatus according to claim 2, further comprising a second semiconductor chip comprising a diode section, wherein:
the first semiconductor chip comprises a transistor section; and
the first electrically-conductive pad is provided in the transistor section.

14. The semiconductor apparatus according to claim 1, wherein
the first thermoelectric member directly connects the first semiconductor chip and the temperature detecting unit, and
the second thermoelectric member directly connects the first semiconductor chip and the temperature detecting unit.

15. The semiconductor apparatus according to claim 3, wherein the temperature detecting unit detects the temperature of the first semiconductor chip based on a sum of a temperature of the temperature detecting unit and the temperature difference between the temperature of the temperature detecting unit and the temperature of the first semiconductor chip.

16. The semiconductor apparatus according to claim 15, wherein the temperature detecting unit detects the temperature difference between the temperature of the temperature detecting unit and the temperature of the first semiconductor chip based on the potential difference between the first thermoelectric member and the second thermoelectric member.

* * * * *